US012563684B2

(12) United States Patent
Jung et al.

(10) Patent No.: US 12,563,684 B2
(45) Date of Patent: Feb. 24, 2026

(54) DISPLAY DEVICE

(71) Applicant: Samsung Display Co., LTD., Yongin-si (KR)

(72) Inventors: Younggyu Jung, Yongin-si (KR); Wee-Joon Jeong, Yongin-si (KR); Kyu-Hun Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 194 days.

(21) Appl. No.: 18/480,782

(22) Filed: Oct. 4, 2023

(65) Prior Publication Data

US 2024/0188242 A1     Jun. 6, 2024

(30) Foreign Application Priority Data

Dec. 2, 2022     (KR) ........................ 10-2022-0166984

(51) Int. Cl.
*H05K 5/02*          (2006.01)
*H05K 5/03*          (2006.01)

(52) U.S. Cl.
CPC ..................................... *H05K 5/03* (2013.01)

(58) Field of Classification Search
CPC ....... H05K 5/0017; H05K 5/0217; H05K 5/03
USPC ........................................ 361/807, 809, 810
See application file for complete search history.

(56) References Cited

U.S. PATENT DOCUMENTS

| | | | | |
|---|---|---|---|---|
| 6,403,206 B1 * | 6/2002 | Bries | .......................... | C09J 7/29 |
| | | | | 428/354 |
| 2002/0172015 A1 * | 11/2002 | Adams | ................... | B60K 35/22 |
| | | | | 361/725 |
| 2007/0247807 A1 * | 10/2007 | Kondo | ...................... | H01J 9/52 |
| | | | | 361/705 |
| 2015/0145755 A1 * | 5/2015 | Yamazaki | ............ | H10K 50/865 |
| | | | | 361/679.01 |
| 2019/0107866 A1 * | 4/2019 | Han | ...................... | G06F 1/1637 |
| 2019/0302835 A1 * | 10/2019 | Yamazaki | ........... | H01M 50/466 |

FOREIGN PATENT DOCUMENTS

| | | | | |
|---|---|---|---|---|
| CN | 113156696 A | * | 7/2021 | ............... G02B 5/22 |
| KR | 10-0344073 | | 12/2002 | |
| KR | 10-1795052 | | 11/2017 | |
| KR | 10-2021-0054118 | | 5/2021 | |
| KR | 10-2272355 | | 7/2021 | |
| KR | 10-2338711 | | 12/2021 | |

* cited by examiner

*Primary Examiner* — Hung S. Bui
(74) *Attorney, Agent, or Firm* — Lerner David LLP

(57)          ABSTRACT

A display device according to an embodiment includes a display panel, a cover member coupled to a rear surface of the display panel, a first adhesive member disposed on the rear surface of the display panel, and a second adhesive member disposed on a front surface of the cover member. The first adhesive member and the second adhesive member are a pair of attachable and detachable members, and the first adhesive member and the second adhesive member are coupled to each other so that the display panel is fixed to the cover member.

16 Claims, 14 Drawing Sheets

210_a

210_b

DR1

DR3 DR2

DR3

DISPLAY DEVICE

CROSS-REFERENCE TO RELATED APPLICATION(S)

This application claims priority to and the benefits of Korean Patent Application No. 10-2022-0166984 under 35 U.S.C. § 119, filed on Dec. 2, 2022, in the Korean Intellectual Property Office (KIPO), the entire contents of which are incorporated herein by reference.

BACKGROUND

1. Technical Field

The disclosure relates to a display device that may be readily reworked.

2. Description of the Related Art

A display device is a device that displays an image, and includes a liquid crystal display (LCD), an organic light emitting diode (OLED), a quantum dot display diode (QLED), a micro LED display, etc.

These display devices are used in various electronic devices such as smartphones, mobile phones, tablets, monitors, televisions, multimedia players, and video game consoles.

Recently, a curved display device having a curved shape is being developed. This curved display device provides a display area with a curved shape, thereby providing the image with improved three-dimensional effect, immersion, and realism to the user.

The above information disclosed in this Background section is only for enhancement of understanding of the background of the described technology, and therefore it may contain information that does not form the prior art that is already known in this country to a person of ordinary skilled in the art.

SUMMARY

Embodiments are intended to efficiently rework the display device.

Specifically, the disclosure provides a display device that may be reworked by separating and reassembling the cover member and the display panel without damaging the cover member and the display panel.

According to an embodiment, a display device may include a display panel, a cover member coupled to a rear surface of the display panel, a first adhesive member disposed on the rear surface of the display panel, and a second adhesive member disposed on a front surface of the cover member. The first adhesive member and the second adhesive member may be a pair of attachable and detachable members, and the first adhesive member and the second adhesive member may be coupled to each other so that the display panel is fixed to the cover member.

The display panel may include a display area and a peripheral area, and the second adhesive member may at least partially overlap the peripheral area of the display panel in a plan view.

The display panel may include a display area and a peripheral area, and the second adhesive member may at least partially overlap the display area of the display panel in a plan view.

The second adhesive member may include a hook region or a lock region.

The pair of the attachable and detachable members may be at least one of a Velcro fastener, a hook-and-loop fastener, a touch fastener, and a dual lock.

The display device according to an embodiment may further include a first fastening member disposed between the display panel and the first adhesive member, and a second fastening member disposed between the cover member and the second adhesive member.

At least one of the first fastening member and the second fastening member may be at least one of a resin, an adhesive, an adhesive tape, and a foam tape.

An adhesiveness between the display panel and the first fastening member may be greater than an adhesiveness between the first adhesive member and the second adhesive member.

The cover member may be formed with a curved surface.

A display device according to an embodiment may include a display panel including a display area and a peripheral area, a cover member coupled to a rear surface of the display panel, a first adhesive member disposed on the rear surface of the display panel, a second adhesive member disposed on a front surface of the cover member, and a third adhesive member disposed between the display panel and the cover member, and overlapping the peripheral area in a plan view. The first adhesive member and the second adhesive member may be coupled to each other so that the display panel is fixed to the cover member.

The first adhesive member and the second adhesive member may be a pair of attachable and detachable members.

The second adhesive member may at least partially overlap the peripheral area of the display panel in a plan view.

The second adhesive member may at least partially overlap the display area of the display panel in a plan view.

The second adhesive member may include a hook region or a lock region.

The pair of the attachable and detachable members may be at least one of a Velcro fastener, a hook-and-loop fastener, a touch fastener, and a dual lock.

The third adhesive member may include a first adhesive layer, a second adhesive layer separated from the first adhesive layer, and a foam layer between the first adhesive layer and the second adhesive layer.

The cover member may be formed with a curved surface.

The display device according to an embodiment may further include a first fastening member disposed between the display panel and the first adhesive member, and a second fastening member disposed between the cover member and the second adhesive member.

At least one of the first fastening member and the second fastening member may be at least one of a resin, an adhesive, an adhesive tape, and a foam tape.

An adhesiveness between the display panel and the first fastening member may be greater than an adhesiveness between the first adhesive member and the second adhesive member.

According to the embodiments, since rework of readily separating and reassembling the display panel and the cover member is possible, the yield may be improved.

While separating the display panel and the cover member, a low temperature disassembly process may be unnecessary, and accordingly, defects such as cracks or shrinkage of the display panel that may occur during the low temperature disassembly process may be prevented. Since long-term exposure at low temperature may be not required and the work may be performed immediately at room temperature, a work time may be shortened.

Since it is not necessary to remove material residues such as a tape or a resin when reassembling after the separation of the display panel and the cover member, the workability may be improved. Additional materials such as a tape or a resin for the reassembly are not required, so material costs may be reduced.

DETAILED DESCRIPTION OF THE EMBODIMENTS

Figure 1:
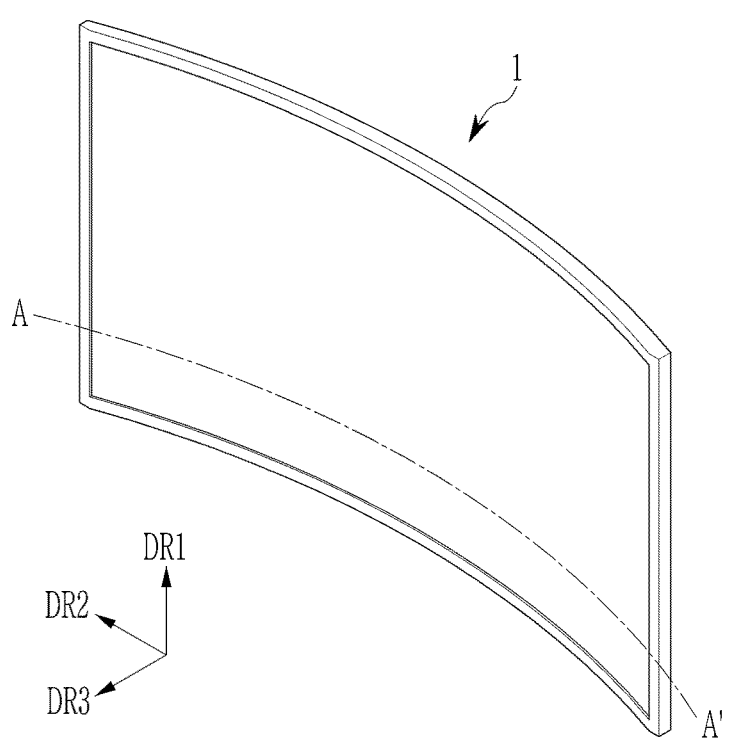
FIG. 1 is a schematic perspective view of a display device according to an embodiment.

Hereinafter, embodiments are described in detail with reference to the accompanying drawings so that those skilled in the art to which the disclosure pertains may readily practice the embodiments. The disclosure may be implemented in various different forms and is not limited to the embodiments provided herein.

A portion unrelated to the description is omitted in order to clearly describe the disclosure, and the same or similar components are denoted by the same reference numeral throughout the specification.

In addition, the size and thickness of each component shown in the accompanying drawings are arbitrarily shown for convenience of explanation, and therefore, the disclosure is not necessarily limited to contents shown in the drawings. In the drawings, the thickness of layers, films, panels, regions, etc., are exaggerated for clarity. In addition, the thicknesses of some layers and regions are exaggerated in the drawings for convenience of explanation.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Further, throughout the specification, an expression "on a plane" or "in a plan view" may indicate a case where a target is viewed from the top, and an expression "on a cross-section" or "in a cross-sectional view" may indicate a case where a cross-section of a target taken along a vertical direction is viewed from its side.

In the drawings, symbols "DR1", "DR2", and "DR3" representing directions are used, where "DR1" is a first direction, "DR2" is a second direction perpendicular to the first direction, and "DR3" is a third direction perpendicular to the first direction and the second direction.

Also, to overlap two constituent elements means that two constituent elements are overlapped in the direction DR3 (e.g., a direction perpendicular to a front surface of the substrate) unless stated otherwise.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic perspective view of a display device according to an embodiment.

A display device 1 according to an embodiment may be a curved display device. The display device 1 according to an embodiment may be used for medium and small electronic equipment such as a personal computer, a laptop computer, a car navigation unit, and a camera as well as large electronic equipment such as televisions or billboards of an analog TV, a digital TV, a 3-D TV, a smart TV, a light emitting diode (LED) TV, an organic light emitting diode (OLED) TV, a plasma TV, a quantum dot TV, etc. The display device 1 may be used for a tablet PC, a smart phone, a personal digital assistant (PDA), a portable multimedia player (PMP), a game machine, an electronic blackboard, and the like, or a wearable device that may be worn on the body.

FIG. 1 shows a curved display device in which a screen is formed as a curved surface, but the following description may be applied to various display devices such as a general display device in which a screen is formed in a flat shape or a bendable display device in which a screen may be bent.

Referring to FIG. 1, the display device 1 according to an embodiment may have a curved shape. The display device 1 may be a curved display device in which the screen has a curved shape as both ends are curved toward the front side compared to the central portion. The curved display devices may display images with improved three-dimensional effect, immersion, and realism through the screen of the curved shape.

Figure 2:
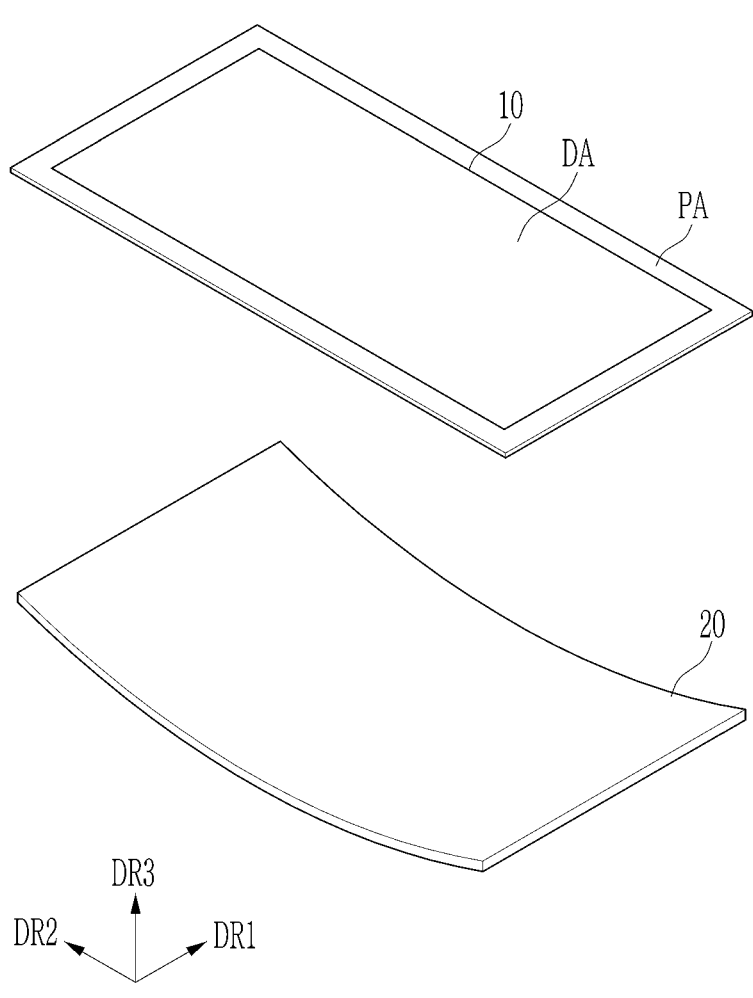
FIG. 2 is a schematic exploded perspective view of a display device according to an embodiment.

FIG. 2 is a schematic exploded perspective view of a display device 1 according to an embodiment.

Referring to FIG. 2, in an embodiment, the display device 1 may include a display panel 10 displaying an image, and a cover member 20 coupled to the rear side of the display panel 10. The surface of display panel 10 on which the image is displayed may be defined as the front of the display panel 10.

The display panel 10 may include various types of display panels such as an organic light emitting panel, an electrophoretic display panel, a quantum dot display panel, and a micro LED display panel.

The display panel 10 may include a display area DA and a peripheral area PA. The display area DA may be a region where an image is displayed and may correspond to a screen. The peripheral area PA may be a region in which an image is not displayed and may surround at least a part of the display area DA. The display area DA may have a substantially rectangular shape in a plan view. The display area DA may be a region where an image is displayed, and multiple pixels may be disposed in the display area DA. For example, the display area DA may include a thin film transistor and a light-emitting element formed on the thin film transistor.

The display panel 10 may be made of a flat panel, and after attached to the cover member 20 with a curved shape, the display panel 10 may be bent, thereby forming the curved shape.

The cover member 20 may support the display panel 10 and may be a chassis that protects the display panel from the environment of the rear. The cover member 20 may include a metal or a metal alloy, and for example may be made of stainless steel. The cover member 20 may include a plastic, and may include both a plastic and a metal.

The cover member 20 may have a shape corresponding to the shape of the display panel 10, and may have a curved surface with both sides bent. For example, the cover member 20 may have a curved rectangular shape and form the rear surface of the display device 1, and the display panel 10 may be attached to the front surface. The rear surface of the display panel 10 may be attached to the front surface of the cover member 20. For example, both ends of the cover member 20 may be formed to be curved toward the front side compared to the central portion, thereby defining the overall shape of the display device 1.

The display device 1 according to an embodiment may be the curved display device formed by attaching the display panel 10 in the shape of the flat rectangular plate to the cover member 20 in the shape of the curved surface.

Figure 3:
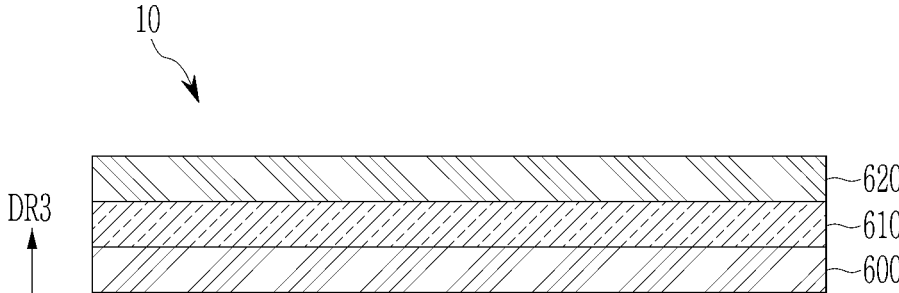
FIG. 3 is a schematic cross-sectional view of a display panel according to an embodiment.

FIG. 3 is a schematic cross-sectional view of a display panel according to an embodiment.

The display panel 10 according to an embodiment may include a substrate 600, a display layer 610, and an encapsulation layer 620.

The substrate 600 may be a flexible substrate including a polymer resin including polyimide, polyamide, or polyethylene terephthalate.

The display layer 610 may be disposed on the substrate 600. The display layer 610 may include a light-emitting element such as a light emitting diode (LED) and a circuit unit for driving the light-emitting element. The circuit unit may include a transistor, a capacitor, wiring, and the like. The light-emitting element may be electrically connected to the transistor to receive a driving current, and may emit light with a luminance (predetermined or selectable luminance).

An encapsulation layer 620 may be disposed on the display layer 610. The encapsulation layer 620 may encapsulate the display layer 610 to protect the light-emitting element from external impurities. The encapsulation layer 620 may be a thin film encapsulation layer including at least one inorganic encapsulation film and at least one organic encapsulation film.

Figure 4:
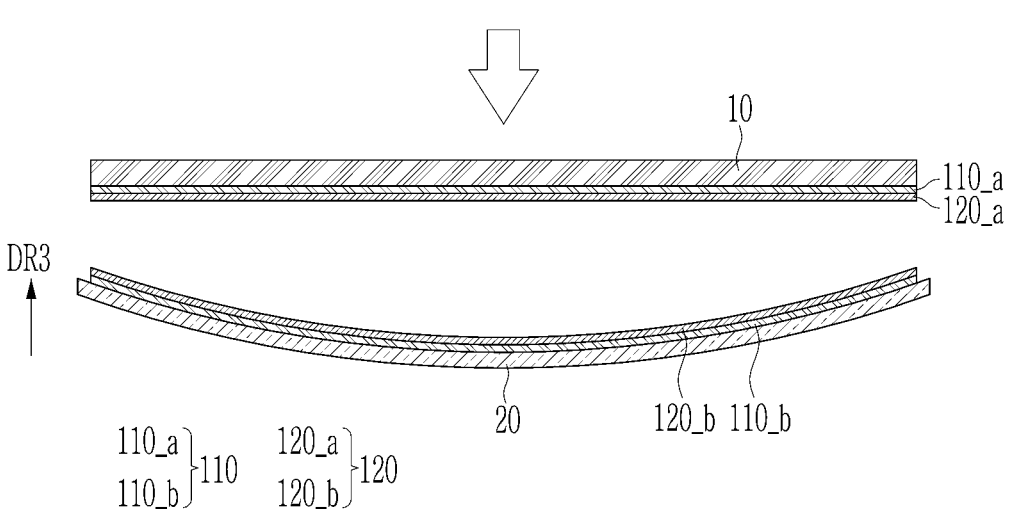
FIG. 4 is a schematic exploded cross-sectional view taken along line A-A' of FIG. 1 according to an embodiment.
Figure 5:
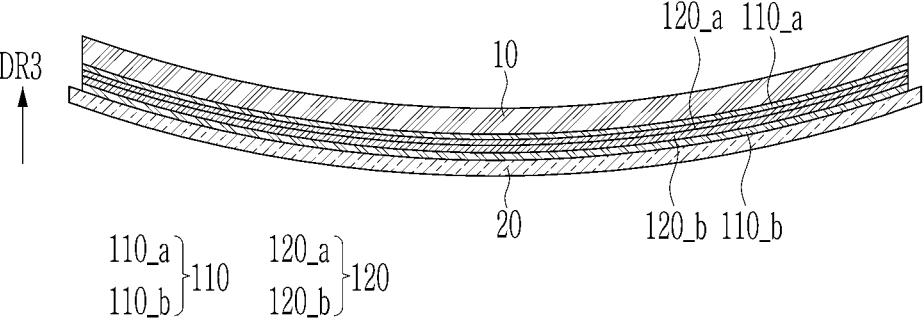
FIG. 5 is a schematic cross-sectional view taken along line A-A' of FIG. 1 according to an embodiment.

FIG. 4 is a schematic exploded cross-sectional view taken along line A-A' of FIG. 1 according to an embodiment. FIG. 5 is a schematic cross-sectional view taken along line A-A' of FIG. 1 according to an embodiment.

Referring to FIG. 4 and FIG. 5, the display panel 10 of the flat shape may be attached to the cover member 20 of the curved shape to form a curved display device. The front of the display panel 10 may be defined as an upper surface, and the rear surface may be defined as a bottom surface. The front surface of the cover member 20 may be defined as an upper surface, and the rear surface may be defined as a bottom surface.

In an embodiment, the bottom surface (the rear surface) of the display panel 10 may be an adhesive surface on which an adhesive member for coupling with the cover member 20 is disposed. In an embodiment, the upper surface (the front surface) of the cover member 20 may be an adhesive surface on which an adhesive member for bonding with the display panel 10 is disposed.

The first adhesive member 120_a for bonding with the cover member 20 may be disposed on the bottom surface of the display panel 10. The fastening member 110_a may be disposed between the display panel 10 and the first adhesive member 120_a. The fastening member 110_a may fix the first adhesive member 120_a to the display panel 10.

The second adhesive member 120_b for coupling with the display panel 10 may be disposed on the upper surface of the cover member 20. The fastening member 110_b may be disposed between the cover member 20 and the second adhesive member 120_*b*. The fastening member 110_*b* may fix the second adhesive member 120_*b* to the cover member 20.

In an embodiment, the fastening member 110 and the adhesive member 120 may have adhesiveness. For example, in case that the display panel is 34-inch, the fastening member 110 and the adhesive member 120 may have an adhesive holding force of greater than or equal to about 17.4 MPa.

The fastening members 110_*a* and 110_*b* may include a material that can attach two or more materials. For example, the fastening member 110 may include a resin, an adhesive, an adhesive tape, a foam tape, or the like.

The first and second adhesive members 120_*a* and 120_*b* may include a material that is readily attachable and detachable. The first adhesive member 120_*a* and the second adhesive member 120_*b* may be formed as a pair that are readily attachable and detachable. For example, the first adhesive member 120_*a* and the second adhesive member 120_*b* may include a Velcro fastener, a hook-and-loop fastener, a touch fastener, and a dual lock, which is attachable and detachable. The Velcro fastener, the hook-and-loop fastener, and the touch fastener may be attachable and detachable members in which a pair of a hook and a lock are attachable and detachable, and the dual lock may be an attachable and detachable member that has a protrusion-type bonding structure and may be attached and detached.

In the display device 1 according to an embodiment, the bottom surface of the display panel 10 and the upper surface of the cover member 20 may be coupled to each other by the first and second adhesive members 120_*a* and 120_*b*. The first adhesive member 120_*a* may be fixed to the lower portion of the display panel 10 by the fastening member 110_*a*. The second adhesive member 120_*b* may be fixed to the cover member 20 by the fastening member 110_*b*. The display panel 10 may be fixed to the cover member 20 by coupling the first adhesive member 120_*a* disposed on the bottom surface of the display panel 10 and the second adhesive member 120_*b* disposed on the upper surface of the cover member 20.

The first and second adhesive members 120_*a* and 120_*b* may be disposed on an edge region of the display device 1. The first adhesive member 120_*a* may be attached to an edge region of the bottom surface of the display panel 10, and the second adhesive member 120_*b* may be attached to an edge region of the upper surface of the cover member 20. The first adhesive member 120_*a* attached to the bottom surface of the display panel 10 may overlap the second adhesive member 120_*b* attached to the upper surface of the cover member 20 in a plan view. The arrangement of the adhesive member 120 is described below with reference to FIG. 6 and FIG. 7.

The adhesiveness between the display panel 10 and the fastening member 110_*a* may be greater than the adhesiveness between the first adhesive member 120_*a* and the second adhesive member 120_*b*. Also, the adhesiveness between the fastening member 110_*a* and the first adhesive member 120_*a* may be greater than the adhesiveness between the first adhesive member 120_*a* and the second adhesive member 120_*b*. The adhesiveness between the cover member 20 and the fastening member 110_*b* may be greater than the adhesiveness between the first adhesive member 120_*a* and the second adhesive member 120_*b*. Also, the adhesiveness between the fastening member 110_*b* and the second adhesive member 120_*b* may be greater than the adhesiveness between the first adhesive member 120_*a* and the second adhesive member 120_*b*.

Accordingly, in case that the display panel 10 and the cover member 20 are separated, the first adhesive member 120_*a* and the second adhesive member 120_*b* may be detached, and the display panel 10 and the cover member 20 may be readily separated.

Figure 6:
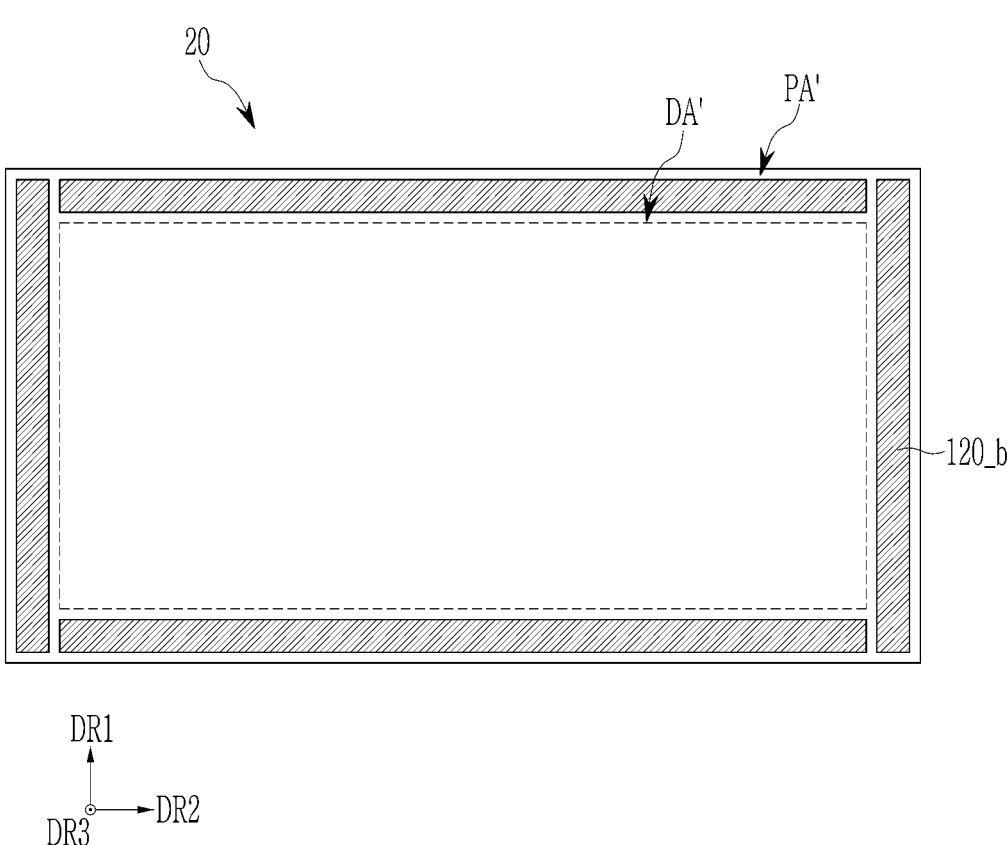
FIG. 6 and FIG. 7 are top plan views illustrating a second adhesive member is disposed on a cover member according to an embodiment.
Figure 7:
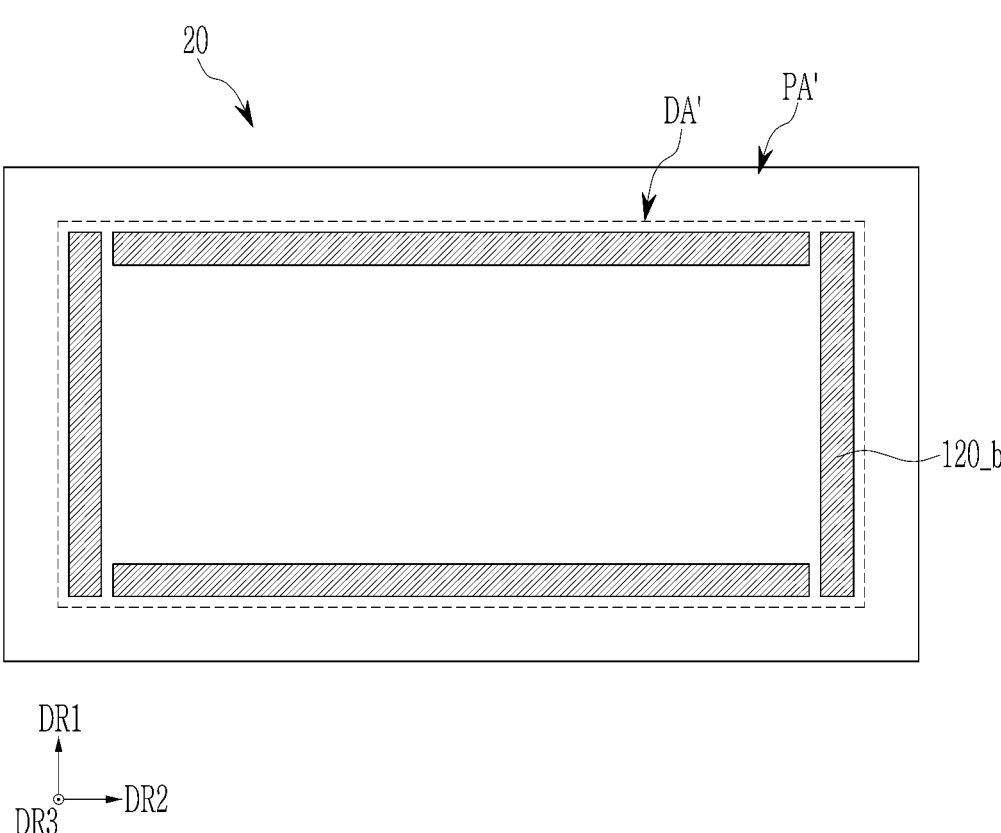

FIG. 6 and FIG. 7 are top plan views illustrating a second adhesive member is disposed on a cover member according to an embodiment. The cover member 20 may include a first region DA' corresponding to the display area DA of the display panel 10 and a second region PA' corresponding to the peripheral area PA of the display panel 10.

Referring to FIG. 6, in an embodiment, the second adhesive member 120_*b* may be disposed in the second region PA' of the cover member 20. Accordingly, in case that the display panel 10 and the cover member 20 are coupled, the second adhesive member 120_*b* may not overlap the display area DA of the display panel 10 in a plan view. The second adhesive member 120_*b* may be entirely disposed along the boundary of the second region PA' of the cover member 20.

Referring to FIG. 7, in an embodiment, the second adhesive member 120_*b* may be disposed in the first region DA' of the cover member 20. Accordingly, in case that the display panel 10 and the cover member 20 are coupled, the second adhesive member 120_*b* may at least partially overlap the display area DA of the display panel 10 in a plan view.

For example, since the organic light emitting panel does not include an additional member such as an additional light emitting device at the bottom of the panel unlike the liquid crystal panel, the adhesive member 120 may be disposed to overlap the display area DA of the display panel 10. Since the adhesive member 120 may be disposed on the inner side of the display device 1 instead of the outer portion, the display panel 10 may be more firmly fixed to the cover member 20. The second adhesive member 120_*b* may be entirely disposed along the boundary of the first region DA' of the cover member 20.

FIG. 6 and FIG. 7 show that the second adhesive member 120_*b* is entirely disposed in the second region PA' of the cover member 20, or the second adhesive member 120_*b* is entirely disposed in the first region DA' of the cover member 20, but the disclosure is not limited thereto, and according to an embodiment, a portion of the second adhesive member 120_*b* may be disposed in the first region DA', and another portion of the second adhesive member 120_*b* may be disposed in the second region PA'. According to an embodiment, the size and the position of the second adhesive member 120_*b* may be variously changed.

FIG. 6 and FIG. 7 show the arrangement of the second adhesive member 120_*b* disposed on the cover member 20, and similarly to this, the first adhesive member 120_*a* may be disposed on the bottom surface of the display panel 10 to correspond to the second adhesive member 120_*b* of the cover member 20.

The first adhesive member 120_*a* on the bottom surface of the display panel 10 may be disposed so as to overlap the second adhesive member 120_*b* of the cover member 20 in a plan view. For example, the first adhesive member 120_*a* may be disposed in the peripheral area PA of the display panel 10 corresponding to the arrangement of the second adhesive member 120_*b*, may be disposed in the display area DA corresponding to the arrangement of the second adhesive member 120_*b*, or a portion of the first adhesive member 120_*a* may be disposed in the peripheral area PA and another portion of the first adhesive member 120_*a* may be disposed in the display area DA corresponding to the arrangement of the second adhesive member 120_*b*.

Accordingly, the first adhesive member 120_*a* and the second adhesive member 120_*b* may form a pair and be coupled to each other to fix the display panel 10 to the cover member 20. The first adhesive member 120_*a* and the second adhesive member 120_*b* may be a pair of attachable and detachable members that is repeatedly attachable and detachable.

Figure 8:
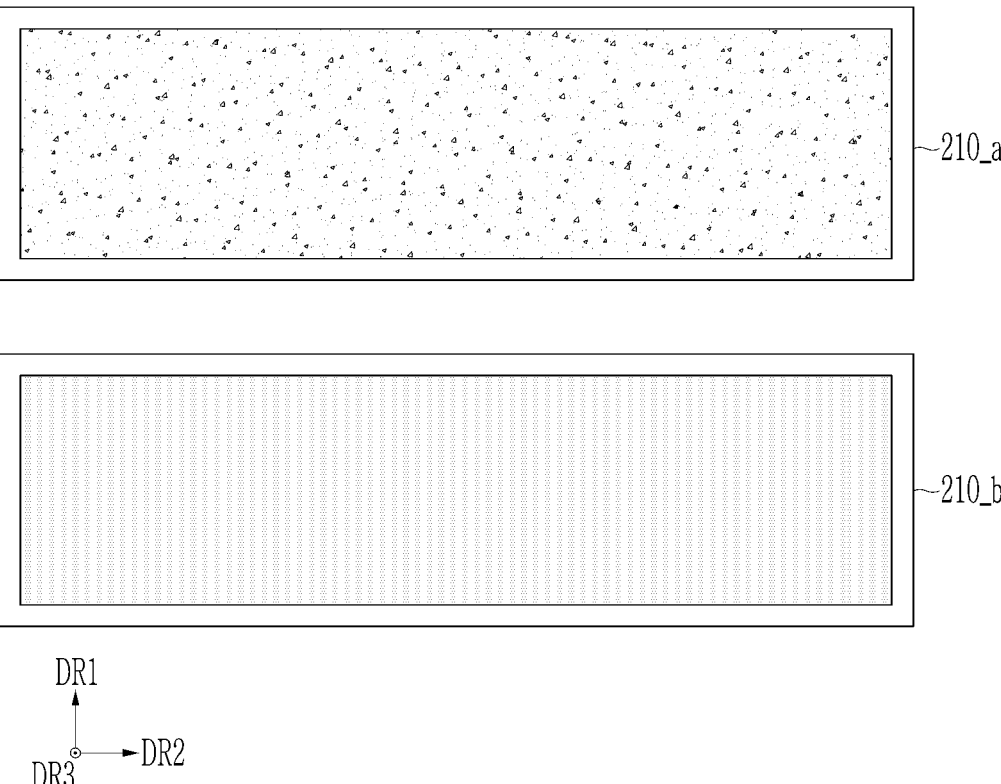
FIG. 8 is a top plan view of first and second adhesive members according to an embodiment.

FIG. 8 is a top plan view of first and second adhesive members according to an embodiment. In an embodiment, the first and second adhesive member may include a pair of Velcro fasteners.

Referring to FIG. 8 along with FIG. 5, in an embodiment, a first adhesive member 120_*a* attached to the lower part of the display panel 10 may include a male part of the Velcro fastener 210_*a*, and a second adhesive member 120_*b* attached to the upper part of the cover member 20 may include a female part of the Velcro fastener 210_*b*, thereby the display panel 10 and the cover member 20 may be readily attachable and detachable. In an embodiment, the first adhesive member 120_*a* may be the female part of the Velcro fastener 210_*b*, and the second adhesive member 120_*b* may be the male part of the Velcro fastener 210_*a*.

The female part of the Velcro fastener 210_*b* may include a lock region in which locks, which are dense and soft threads, are densely disposed. The male part of the Velcro fastener 210_*a* may include a hook region including multiple hooks that can be hooked on and fixed to the lock of the female part of the Velcro fastener 210_*b*. The female part of the Velcro fastener 210_*b* and the male part of the Velcro fastener 210_*a* may form a pair and stick to each other as coupled so that they may have an adhesive holding power. The contact surface, which is the bonding surface of the Velcro fastener 210_*a* and 210_*b*, may be readily separated by an external force and may be readily recoupled.

Figure 9:
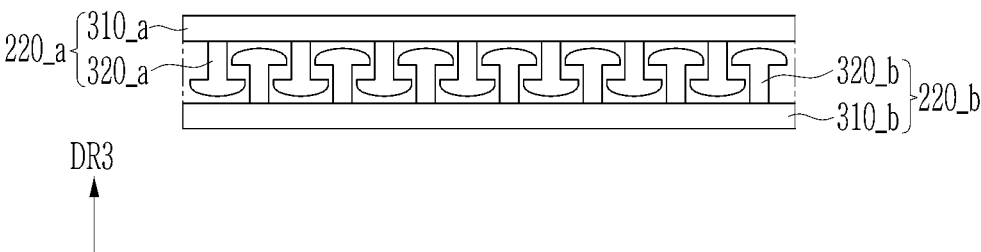
FIG. 9 is a schematic cross-sectional view of first and second adhesive members according to another embodiment.

FIG. 9 is a schematic cross-sectional view of first and second adhesive members according to an embodiment. In an embodiment, the first and second adhesive members may each include a dual lock.

Referring to FIG. 9 along with FIG. 5, in an embodiment, the first adhesive member 120_*a* attached to the lower part of the display panel 10 may include a first dual lock 220_*a*, and the second adhesive member 120_*b* attached to the upper part of the cover member 20 may include a second dual lock 220_*b*. The first dual lock 220_*a* may include a base member 310_*a* and multiple protrusions 320_*a* of a mushroom shape formed on the base member 310_*a*. The protrusions 320_*a* may be spaced apart by an interval. The second dual lock 220_*b* may include a base member 310_*b* and a protrusion 320_*b* of a mushroom shape formed on the base member. The protrusion 320_*b* may be spaced apart by an interval.

Since the first and second dual locks 220_*a* and 220_*b* each includes a mushroom-shaped protrusion 320_*a* and 320_*b*, in case that the first and second dual locks 220_*a* and 220_*b* are coupled with each other, the protrusion head of each may be engaged with each other and be fixed. Accordingly, the first and second dual locks 220_*a* and 220_*b* may be attached and detached readily while being strongly bonded. The adhesiveness of the first and second dual locks 220_*a* and 220_*b* may be determined according to the size, the number, the spacing, and the density of the mushroom-shaped protrusions 320_*a* and 320_*b*. The dual lock may be a genderless structure, and the first and second dual locks 220_*a* and 220_*b* may be the same member.

FIG. 9 illustrates the dual lock with the mushroom-shaped protrusion structure, but the disclosure is not limited thereto, and the first and second adhesive members may be configured with various head shapes that may make a hook.

According to an embodiment, the display device 1 according to an embodiment may use attachable and detachable member that is repeatedly attachable and detachable as a bonding member in case that the display panel 10 and cover member 20 are coupled, so it may be readily separate the display panel 10 and cover member 20. The display device 1 according to an embodiment may have following advantageous process effects because it is readily separate the display panel 10 and the cover member 20 during the process rework.

For example, as the attachable and detachable member is used as the bonding member, a low temperature disassembly process is unnecessary during the rework. Therefore, defects such as cracks or shrinkage of the display panel 10 that may occur during the low temperature disassembly process may be prevented. Since long-term exposure at low temperature is not required and the work may be performed immediately at room temperature, the work time may be shortened. As the attachable and detachable members are used, the rework may be performed by readily separating and reassembling the display panel and the cover member 20, so the yield may be improved. In case of reassembling after the separation of the display panel 10, it is not necessary to remove material residues such as a tape or a resin, so a workability may be improved, and a material cost may be reduced because additional materials such as a tape or a resin are not required for the reassembly.

Figure 10:
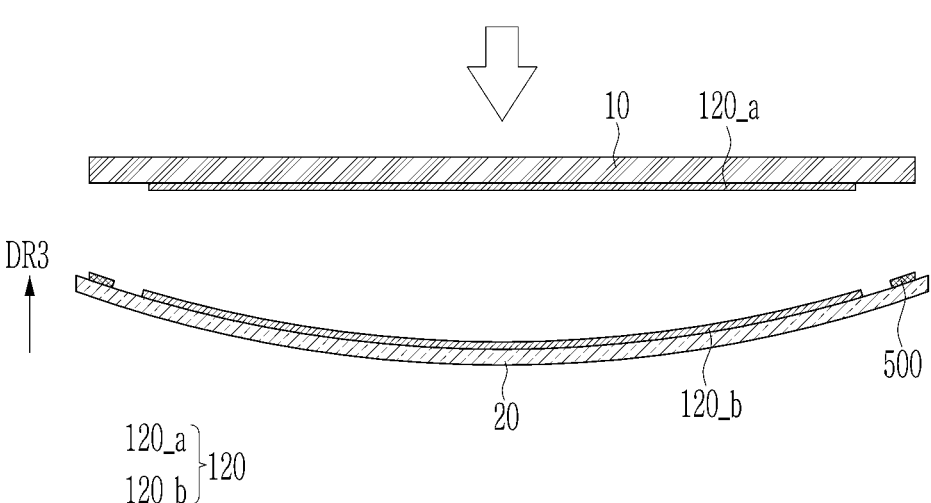
FIG. 10 is a schematic exploded sectional view taken along line A-A' of FIG. 1 according to an embodiment.
Figure 11:
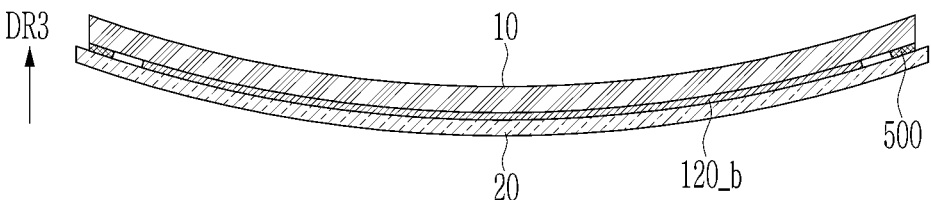
FIG. 11 is a schematic cross-sectional view taken along line A-A' of FIG. 1 according to an embodiment.

FIG. 10 is a schematic exploded cross-sectional view taken along line A-A' of FIG. 1 according to an embodiment. FIG. 11 is a schematic cross-sectional view taken along line A-A' of FIG. 1 according to an embodiment.

Referring to FIG. 10 and FIG. 11, a curved display device may be formed by attaching the flat display panel 10 to the curved cover member 20. The bottom surface of the display panel 10 may be an adhesive surface on which an adhesive member for bonding with the cover member 20 is disposed. The upper surface of the cover member 20 may be an adhesive surface on which an adhesive member for bonding with the display panel 10 is disposed.

The first adhesive member 120_*a* for bonding with the cover member 20 may be disposed on the bottom surface of the display panel 10. The second adhesive member 120_*b* for coupling with the display panel 10 may be disposed on the upper surface of the cover member 20.

Although not shown, fastening members may be disposed between the display panel 10 and the first adhesive member 120_*a* and between the cover member 20 and the second adhesive member 120_*b*. The fastening member may fix the display panel 10 and the first adhesive member 120_*a*, and may fix the cover member 20 and the second adhesive member 120_*b*. The fastening member may include a material that can attach two or more materials. For example, the fastening member may include a resin, an adhesive, an adhesive tape, a foam tape, or the like.

The first and second adhesive members 120_*a* and 120_*b* may include a material that is readily attachable and detachable. The first adhesive member 120_*a* and the second adhesive member 120_*b* may be formed as a pair and may be configured to be readily attachable and detachable. For example, the first adhesive member 120_*a* and the second adhesive member 120_*b* may include a Velcro fastener, a hook-and-loop fastener, a touch fastener, a dual lock, or the like, which is attachable and detachable.

A third adhesive member 500 may be disposed on the outer edge region of the upper surface of the cover member

US 12,563,684 B2

11

20. The third adhesive member 500 may be disposed on the edge of the display device and may be readily removed. For example, the third adhesive member 500 may include a foam tape, and the foam tape may be disposed on outer edges of the display panel 10 and the cover member 20 to fix the display panel 10 to the cover member 20. The foam layer of the foam tape may be readily cut, and accordingly, the materials attached to both sides of the foam tape may also be readily separated.

Figure 12:
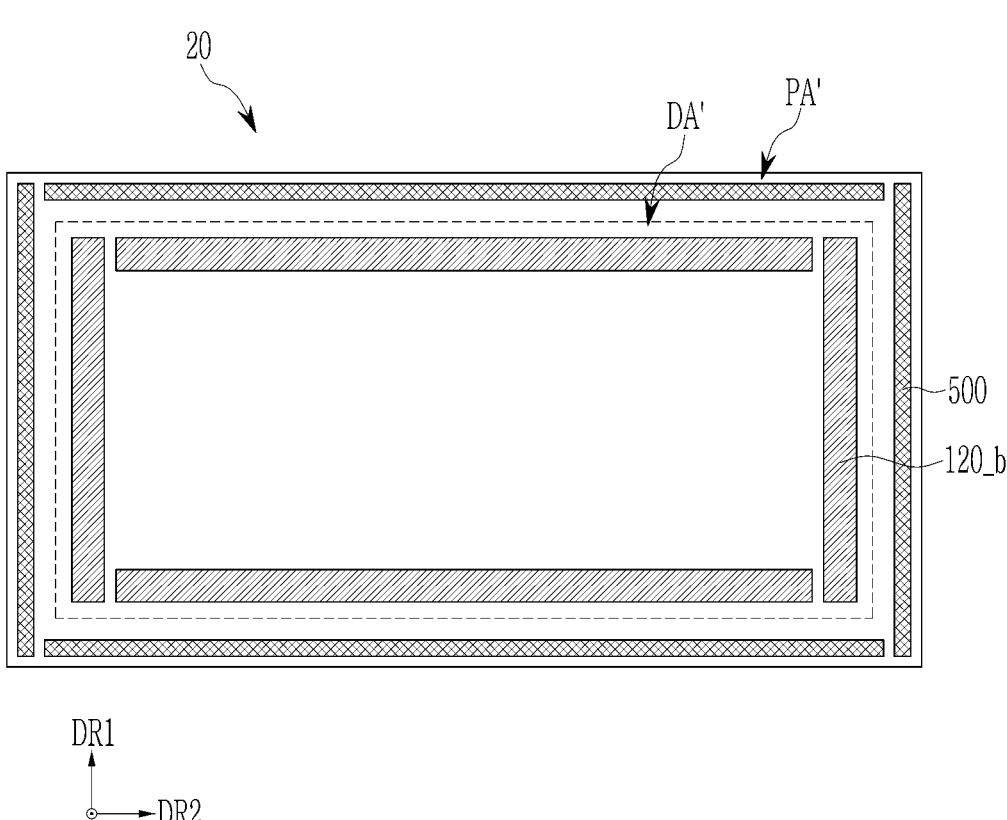
FIG. 12 is a top plan view in which second and third adhesive members are disposed in a cover member according to an embodiment.

FIG. 12 is a top plan view in which a second adhesive member and a third adhesive member are disposed on a cover member 20 according to an embodiment. The cover member 20 may include a first region DA' corresponding to the display area DA of the display panel 10 and a second region PA' corresponding to the peripheral area PA of the display panel 10.

Referring to FIG. 12 along with FIG. 11, in an embodiment, the third adhesive member 500 may be disposed in the second region PA' of the cover member 20. The third adhesive member 500 may be disposed between the peripheral area PA of the display panel 10 and the second region PA' of the cover member 20 corresponding thereto. Accordingly, in case that the display panel 10 and the cover member 20 are coupled, the third adhesive member 500 may not overlap the display area DA of the display panel 10 in a plan view.

The third adhesive member 500 may be entirely disposed along the boundary of the second region PA' of the cover member 20. For example, the third adhesive member 500 may be disposed on the edge of the peripheral area of the display device, and for example, the third adhesive member 500 may be disposed within about 60 mm from the outer boundary of the display device. Accordingly, the third adhesive member 500 may be readily removed from the outside.

FIG. 12 illustrates that the third adhesive member 500 may be disposed on all four edges of the cover member 20, but the disclosure is not limited thereto, and in an embodiment, the third adhesive member 500 may be disposed only at some corners, or may be disposed along the edge with intervals without continuity.

In an embodiment, the second adhesive member 120_b may be disposed in the first region DA' of the cover member 20. Accordingly, after the display panel 10 and the cover member 20 are coupled, the second adhesive member 120_b may at least partially overlap the display area DA of the display panel 10 in a plan view.

For example, since the organic light emitting panel does not include an additional member such as an additional light emitting device at the bottom of the panel unlike the liquid crystal panel, the adhesive member 120 may be disposed to overlap the display area DA of the display panel 10 in a plan view, and since the adhesive member 120 is disposed inside the display area, adhesion strength may be improved.

In FIG. 12, the second adhesive member 120_b is shown to be disposed in the first region DA' of the cover member 20, but the disclosure is not limited thereto, and according to an embodiment, a portion of the second adhesive member 120_b may be disposed in the second region PA' of the cover member 20, or a portion of the second adhesive member 120_b may be disposed in the first region DA' and another portion of the second adhesive member 120_b may be disposed in the second region PA'.

FIG. 12 shows the arrangement of the second adhesive member 120_b disposed on the cover member 20, and similarly, the first adhesive member 120_a may be disposed to correspond to the second adhesive member 120_b of the cover member 20 at the bottom surface of the display panel 10. For example, the first adhesive member 120_a on the bottom surface of the display panel 10 may be disposed so as to overlap the second adhesive member 120_b of the cover member 20 in a plan view. The first adhesive member 120_a and the second adhesive member 120_b may form a pair and be combined to fix the display panel 10 to the cover member 20.

As described above, the display device 1 according to an embodiment may include the third adhesive member 500 on the edge of the display device and may include the first and second bonding members that is being attachable and detachable in the first region DA' of the display device during the coupling of the display panel 10 and the cover member 20, thereby the adhesion strength may be improved, and the display panel 10 and the cover member 20 may be readily separated and reassembled in case that the display device 1 is reworked.

Figure 13:
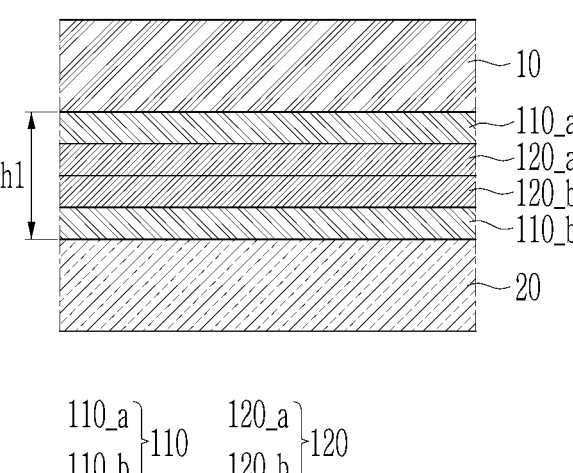
FIG. 13 is a schematic cross-sectional view of a portion of a display panel and a cover member fixed by first and second adhesive members.
Figure 14:
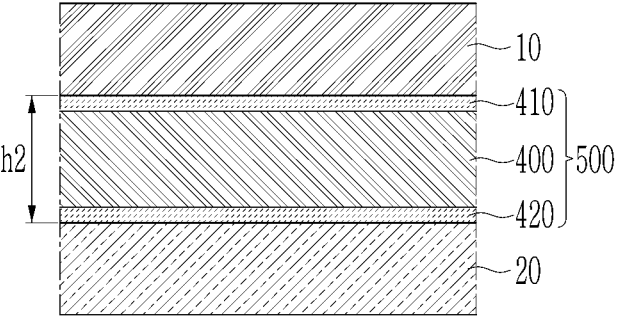
FIG. 14 is a schematic cross-sectional view of a portion of a display panel and a cover member fixed by a third adhesive member.

FIG. 13 is a schematic cross-sectional view of a portion of a display panel and a cover member fixed by first and second adhesive members. FIG. 14 is a schematic cross-sectional view of a portion of a display panel and a cover member fixed by a third adhesive member.

Referring to FIG. 13, the display panel 10 and the cover member 20 may be coupled using first and second adhesive members 120_a and 120_b.

The first fastening member 110_a may be disposed on the bottom surface of the display panel 10. The first fastening member 110_a may include a material that can attach two or more materials and may fix the first adhesive member 110_a to the display panel 10.

The second fastening member 110_b may be disposed on the upper surface of the cover member 20. The second fastening member 110_b may include a material that can attach two or more materials, and may fix the second adhesive member 110_b to the cover member 20.

The first and second adhesive members 120_a and 120_b may include attachable and detachable materials. The first adhesive member 120_a and the second adhesive member 120_b may be formed as a pair and be configured to be readily attachable and detachable. For example, the first adhesive member 120_a and the second adhesive member 120_b may include a Velcro fastener, a hook-and-loop fastener, a touch fastener, a dual lock, or the like, which is attachable and detachable.

A distance h1 between the display panel 10 and the cover member 20 may be same as the sum of a thickness of each of the first fastening member 110_a, the first adhesive member 120_a, the second adhesive member 120_b, and the second fastening member 110_b. The fastening member 110 and the adhesive member 120 may have various thicknesses and types, and may be applied with different types and thicknesses according to embodiments.

The adhesiveness between the display panel 10 and the fastening member 110_a may be greater than the adhesiveness between the first adhesive member 120_a and the second adhesive member 120_b. Also, the adhesiveness between the first fastening member 110_a and the first adhesive member 120_a may be greater than the adhesiveness between the first adhesive member 120_a and the second adhesive member 120_b. The adhesiveness between the cover member 20 and the second fastening member 110_b may be greater than the adhesiveness between the first adhesive member 120_a and the second adhesive member 120_b. Also, the adhesiveness between the second fastening member 110_b and the second adhesive member 120_b may be greater than the adhesiveness between the first adhesive member 120_a and the second adhesive member 120_b.

Accordingly, in case that the display panel 10 and the cover member 20 are separated, the first adhesive member 120_a and the second adhesive member 120_b may be detached, and the display panel 10 and the cover member 20 may be readily separated.

As described above, the display device 1 according to an embodiment may include the bonding member 120, which is readily attachable and detachable as bonding the display panel 10 and the cover member 20, so the separation of the display panel 10 and the cover member 20 may be readily performed during the rework of the display device 1.

FIG. 14 is a schematic cross-sectional view of a portion of a display panel and a cover member fixed by a third adhesive member. Referring to FIG. 14, the display panel 10 and the cover member 20 may be coupled using a third adhesive member 500.

The third adhesive member 500 may be disposed between the display panel 10 and the cover member 20.

The third adhesive member 500 may include first and second adhesive layers 410 and 420, and a foam layer 400 disposed between the first and second adhesive layers 410 and 420. The foam layer 400 may be a layer to improve the adhesiveness of the adhesive layers and an object, and may include a flexible material. For example, the foam layer 400 may uniformly attach the first and second adhesive layers 410 and 420 to the adhesive surface of the display panel 10 and the cover member 20.

Referring to FIG. 14, the second adhesive layer 420 may be disposed on the cover member 20, the foam layer 400 may be disposed on the second adhesive layer 420, the first adhesive layer 410 may be disposed on the foam layer 400, and the display panel 10 may be disposed on the first adhesive layer 410.

A distance h2 between the display panel 10 and the cover member 20 may be equal to the sum of a thickness of each of the first adhesive layer 410, the foam layer 400, and the second adhesive layer 420. The first and second adhesive layer 410 and 420 and the foam layer 400 may have various thicknesses and types, and may be applied with different types and thicknesses according to embodiments.

Referring to FIG. 13 and FIG. 14, the distance h1 between the display panel 10 and the cover member 20 of the portions fixed by the first and second adhesive members and the distance h2 between the display panel 10 and the cover member 20 of the portions fixed by the third adhesive member may be the same. Accordingly, the display panel 10 and the cover member 20 may be stably fixed.

The third adhesive member 500 may be disposed near the edge of the display device, and may be separated by cutting the foam layer 400 between the first and second adhesive layers 410 and 420. Accordingly, the display panel 10 and the cover member 20 may be readily separated.

As such, the display device according to an embodiment may include the third adhesive member 500, which may be readily removed from the outside, at the outer part as combining the display panel and the cover member, and may include the bonding member that may be attached and detachable inside, thereby improving the adhesion strength and readily separating the display panel 10 and the cover member 20.

For example, as the material that is readily attachable and detachable is used as the bonding member, a low temperature disassembly process may be unnecessary during the rework. Accordingly, defects such as cracks or shrinkage of the display panel 10 that may occur in the low temperature disassembly process may be prevented. Since long-term exposure at low temperature is not required and a work may be performed immediately at room temperature, a work time may be shortened. By using the bonding member, which is readily attachable and detachable, the rework may be performed by readily separating and reassembling the display panel and the cover member 20, and the yield may be improved. In case of reassembling after the separation of the display panel 10, it may be not necessary to remove material residues such as a tape or a resin, so workability may be improved, and a material cost may be reduced because additional materials such as a tape or a resin are not required for the reassembly.

In an embodiment, the method of attaching the display panel 10 to the cover member 20 of the curved display device in which the screen is formed of the curved surface is described, but the disclosure is not limited thereto, and the method may also be applied in various ways to a general display device in which a screen is formed of a flat shape, or a bendable display device in which a screen may be bent into flat and curved surfaces.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display panel;
a cover member coupled to a rear surface of the display panel;
a first adhesive member disposed on the rear surface of the display panel;
a second adhesive member disposed on a front surface of the cover member;
a first fastening member disposed between the display panel and the first adhesive member, the first fastening member includes an adhesive material that can attach two or more materials; and
a second fastening member disposed between the cover member and the second adhesive member, the second fastening member includes an adhesive material that can attach two or more materials, wherein
the first adhesive member and the second adhesive member are a pair of attachable and detachable members, and
the first adhesive member and the second adhesive member are coupled to each other so that the display panel is fixed to the cover member, wherein the second adhesive member includes a hook region or a lock region.

2. The display device of claim 1, wherein
the display panel includes a display area and a peripheral area, and
the second adhesive member at least partially overlaps the peripheral area of the display panel in a plan view.

3. The display device of claim 1, wherein the display panel includes a display area and a peripheral area, and the second adhesive member at least partially overlaps the display area of the display panel in a plan view.

4. The display device of claim 1, wherein the pair of the attachable and detachable members are at least one of a Velcro fastener, a hook-and-loop fastener, a touch fastener, and a dual lock.

5. The display device of claim 1, wherein at least one of the first fastening member and the second fastening member is at least one of a resin, an adhesive, an adhesive tape, and a foam tape.

6. The display device of claim 1, wherein an adhesiveness between the display panel and the first fastening member is greater than an adhesiveness between the first adhesive member and the second adhesive member.

7. The display device of claim 1, wherein the cover member is formed with a curved surface.

8. A display device comprising:

a display panel including a display area and a peripheral area;

a cover member coupled to a rear surface of the display panel;

a first adhesive member disposed on the rear surface of the display panel;

a second adhesive member disposed on a front surface of the cover member;

a third adhesive member disposed between the display panel and the cover member;

a first fastening member disposed between the display panel and the first adhesive member, the first fastening member includes an adhesive material that can attach two or more materials; and a second fastening member disposed between the cover member and the second adhesive member, the second fastening member includes an adhesive material that can attach two or more materials, and overlapping the peripheral area in a plan view, wherein the first adhesive member and the second adhesive member are coupled to each other so that the display panel is fixed to the cover member, wherein the second adhesive member includes a hook region or a lock region.

9. The display device of claim 8, wherein the first adhesive member and the second adhesive member are a pair of attachable and detachable members.

10. The display device of claim 9, wherein the pair of the attachable and detachable members are at least one of a Velcro fastener, a hook-and-loop fastener, a touch fastener, and a dual lock.

11. The display device of claim 8, wherein the second adhesive member at least partially overlaps the peripheral area of the display panel in a plan view.

12. The display device of claim 8, wherein the second adhesive member at least partially overlaps the display area of the display panel in a plan view.

13. The display device of claim 8, wherein the third adhesive member includes:

a first adhesive layer;

a second adhesive layer separated from the first adhesive layer; and a foam layer between the first adhesive layer and the second adhesive layer.

14. The display device of claim 8, wherein the cover member is formed with a curved surface.

15. The display device of claim 8, wherein at least one of the first fastening member and the second fastening member is at least one of a resin, an adhesive, an adhesive tape, and a foam tape.

16. The display device of claim 8, wherein an adhesiveness between the display panel and the first fastening member is greater than an adhesiveness between the first adhesive member and the second adhesive member.

\* \* \* \* \*